United States Patent [19]
Reisinger

[11] Patent Number: 6,137,718
[45] Date of Patent: Oct. 24, 2000

[54] METHOD FOR OPERATING A NON-VOLATILE MEMORY CELL ARRANGEMENT

[75] Inventor: Hans Reisinger, Grünwald, Germany

[73] Assignee: Siemens Aktiengesellschaft, Munich, Germany

[21] Appl. No.: 09/230,612

[22] PCT Filed: Jul. 8, 1997

[86] PCT No.: PCT/DE97/01432

§ 371 Date: Jan. 28, 1999

§ 102(e) Date: Jan. 28, 1999

[87] PCT Pub. No.: WO98/06101

PCT Pub. Date: Feb. 12, 1998

[30] Foreign Application Priority Data

Aug. 1, 1996 [DE] Germany .......................... 196 31 154

[51] Int. Cl.$^7$ ................................................. G11C 11/34
[52] U.S. Cl. ............................... 365/185.03; 365/185.28; 257/324
[58] Field of Search ..................... 365/185.03, 185.28, 365/185.01; 257/324

[56] References Cited

U.S. PATENT DOCUMENTS

| | | | |
|---|---|---|---|
| 3,979,582 | 9/1976 | Mims ....................................... | 235/193 |
| 4,057,788 | 11/1977 | Sage ........................................ | 365/174 |
| 5,311,049 | 5/1994 | Tsuruta .................................... | 257/324 |
| 5,436,481 | 7/1995 | Egawa et al. ............................ | 257/324 |
| 5,539,690 | 7/1996 | Talreja et al. ....................... | 365/185.22 |
| 5,768,184 | 6/1998 | Hayashi et al. ..................... | 365/185.03 |
| 5,818,753 | 10/1998 | Gotou .................................. | 365/185.03 |

FOREIGN PATENT DOCUMENTS

| 0 311 773 | 4/1989 | European Pat. Off. . |
|---|---|---|
| 0 692 825 | 1/1996 | European Pat. Off. . |

OTHER PUBLICATIONS

Patent Abstracts of Japan, vol. 7, No. 206, (P–222), Sep. 10, 1983 & JP 58 102394, dated Jun. 17, 1983.

IBM Corp. (1993), IBM Technical Disclosure Bulletin, P.J. Krick, Three State MNOS FET Memory Array, (May 1976), pp. 1–2.

Reprinted from IEDM Tech. Dig., pp. 580–583, (1986), S. K. Lai et al, "Comparison and Trends in Today's Dominant $E^2$ Technologies", pp. for this article now being 121–124.

IEEE Electron Device Letters, vol. EDL–8, No. 3, Mar. 1987, T. Y. Chan et al, A True–Single–Transistor Oxide–Nitride–Oxide EEPROM Device, pp. 93–95.

*Primary Examiner*—David Nelms
*Assistant Examiner*—Hoal V. Ho
*Attorney, Agent, or Firm*—Hill & Simpson

[57] ABSTRACT

In order to increase the storage density, in a memory cell arrangement having MOS transistors as memory cells which has as gate dielectric, a dielectric triple layer having a first silicon oxide layer, a silicon nitride layer and a second silicon oxide layer, the silicon oxide layers each having a thickness of at least 3 nm, the information is stored using multi-value logic with up to $2^6$ values. In this case, use is made of the fact that these memory cells have a time period greater than 1000 years for data retention and their threshold voltage has a very small drift.

7 Claims, 1 Drawing Sheet

METHOD FOR OPERATING A NON-VOLATILE MEMORY CELL ARRANGEMENT

BACKGROUND OF THE INVENTION

For the permanent storage of data, nonvolatile EEPROM cells are usually used. Various technologies have been proposed for realising EEPROM cells (see, for example, Lai et al., IEDM Tech. Dig., 1986, pages 580–583).

On the one hand, specific MOS transistors are used as memory cells in the so-called SONOS or MNOS cells. The MOS transistor comprises a gate dielectric comprising at least one silicon oxide layer underneath the gate electrode and a silicon oxide layer between the silicon nitride layer and the channel region. In order to store information, charge carriers are stored in the silicon nitride layer.

The silicon oxide layer has a maximum thickness of 2.2 mm in SONOS cells. The silicon nitride layer usually has a thickness of about 10 nm in modern SONOS memories. A further silicon oxide layer, having a thickness of 3 to 4 nm, is usually provided between the silicon nitride layer and the gate electrode. These nonvolatile memory cells can be written to and erased electrically. During a writing operation, a voltage is applied to the gate electrode such that charge carriers tunnel from the substrate through the silicon oxide layer having a maximum thickness of 2.2 nm into the silicon nitride layer. For erasure, the gate electrode is connected up in such a way that the charge carriers stored in the silicon nitride layer tunnel through the silicon oxide layer having a thickness of 2 nm into the channel region and charge carriers of the opposite conductivity type tunnel from the channel region through the silicon oxide layer into the silicon nitride layer.

SONOS cells having a time period of $\leq 10$ years for data retention. This time period is too short for many applications, for example for the storage of data in computers.

EEPROM cells with floating gate are used as an alternative to the SONOS cells. These EEPROM cells are suitable for applications in which longer time periods are required for data retention. In these memory cells, a floating gate electrode, which is completely surrounded by dielectric material, is arranged between a control gate electrode and the channel region of the MOS transistor. The information is stored in the form of charge carriers on the floating gate electrode. These memory cells, which are also referred to as FLOTOX cells, can be written to and erased electrically. For this purpose, the control gate electrode is connected to a potential such that charge carriers flow from the channel region onto the floating gate electrode (writing) or charge carriers flow from the floating gate electrode into the channel region (erasure). These FLOTOX cells have time periods of < than 150 years for data retention.

However, they have a complicated structure in comparison with the SONOS cells. Furthermore, FLOTOX cells require more space than SONOS cells since the control gate electrode must laterally overlap the floating gate electrode. Finally, the so-called radiation hardness of FLOTOX cells is limited. Radiation hardness refers to the insensitivity of the stored charge to external radiation sources and/or electromagnetic fields.

In order to increase the storage density in FLOTOX cells, it has been proposed (see, for example, Lai et al., IEDM Tech. Dig., 1986, pages 580–583) to store information in the sense of multi-value logic. In this case, more than 3 logic values are stored by unambiguously assigning a threshold voltage value of the MOS transistor to each logic value. In the course of programming, the different threshold voltage values are set, in dependence on the logic value to be stored, by injecting different quantities of charge.

SUMMARY OF THE INVENTION

The invention is based on the problem of specifying a method for operating a memory cell arrangement in which an increased storage density is achieved compared with the prior art and in which a time period of at least 150 years for data retention is achieved.

In general terms the present invention is a method for operating a memory cell arrangement. The memory cells used are MOS transistors having, as gate dielectric, a dielectric triple layer having a silicon oxide layer, a silicon nitride layer and a second silicon oxide layer, the first silicon oxide layer and the second silicon oxide layer each having a thickness of at least 3 nm. Multi-value logic with more than two logic values is used in order to store information. In order to write the logic values to one of the memory cells, a respective quantity of charge assigned to the logic value is applied to the gate dielectric by Fowler-Nordheim tunneling and is stored in the gate dielectric, which quantity of charge effects a threshold voltage level of the MOS transistor which is assigned to the logic value.

Advantageous developments of the present invention are as follows.

The amount separating neighboring threshold voltage levels increase as the threshold voltage level increases.

The difference between the thickness of the first silicon oxide layer and the second silicon oxide layer lies in the range between 0.5 nm and 1 nm.

The smaller of the thicknesses of the first silicon oxide layer and of the second silicon oxide layer lies in the range between 3 and 6 nm.

The silicon nitride layer has a thickness of at least 5 nm.

The MOS transistor in each case has a gate electrode made of n-doped silicon. Furthermore, multi-value logic with $2^n$ values is used, where n is between 2 and 6.

The difference between the thicknesses of the first silicon oxide layer and the second silicon oxide layer lies in the range between 0.5 nm and 1 nm. The smaller of the thicknesses of the first silicon oxide layer and of the second silicon oxide layer lies in the range between 3.2 and 4 nm. The silicon nitride layer has a thickness of at least 5 nm. The MOS transistor in each case has a gate electrode made of $p^+$-doped silicon. The $p^+$-doped silicon in the gate electrode has a dopant concentration of at least $1 \times 10^{20}$ cm$^{-3}$. The multi-value logic with $2^n$ values is used, where n is between 2 and 3.

In the method according to the invention, a memory cell arrangement is used which comprises, as memory cells, in each case a MOS transistor with source region, channel region, drain region, gate dielectric and gate electrode, the gate dielectric of which transistor is in the form of a dielectric triple layer. The dielectric triple layer comprises a first silicon oxide layer, a silicon nitride layer and a second silicon oxide layer. The silicon nitride layer is arranged between the two silicon oxide layers. The first silicon oxide layers and the second silicon oxide layer each have a thickness of at least 3 nm.

The memory cell used in the method according to the invention differs from conventional SONOS cells by the fact that the first silicon oxide layer, which is arranged between the channel region of the MOS transistor and the silicon nitride layer, has a thickness of at least 3 nm. This thickness is at most 2.2 nm in conventional SONOS cells.

The method according to the invention makes use the insight that in conventional SONOS cells, the charge transport through the first silicon oxide layer takes place primarily. by means of direct tunneling and modified Fowler-Nordheim tunneling. The probability for direct tunneling and modified Fowler-Nordheim tunneling and thus the current intensity for the charge transport by these tunneling mechanisms depend primarily on the thickness of the tunneling barrier, that is to say the thickness of the first silicon oxide layer, and on the electric field. Since the first silicon oxide layer has a maximum thickness of 2.2 nm and the second silicon oxide layer a thickness of 3 to 4 nm is conventional SONOS cells, the current due to direct tunneling through the first silicon oxide layer is always predominant given electric fields of below 10 MV/cm. The information is both written and erased by means of this direct tunneling current, by virtue of the gate electrode being connected up correspondingly.

In conventional SONOS cells, even without the gate electrode being connected up, a tunneling current ascribed to direct tunneling flows through the first silicon oxide layer from the silicon nitride layer to the channel region. It has been ascertained that this direct tunneling current determines the time period for data retention.

Moreover, the method according to the invention makes use of the fact that the probability for direct tunneling greatly decreases as the thickness of the first silicon oxide layer increases, and becomes very low given a thickness of at least 3 nm. At a thickness of 3 nm, the probability for direct tunneling is less than in the case of 2 nm approximately by a factor of $10^6$.

Since, in the memory cell which is used in the method according to the invention, the first silicon oxide layer and the second silicon oxide layer each have a thickness of at least 3 nm, charge carrier transport from the silicon nitride layer to the gate electrode or to the channel region as a result of direct tunneling is largely avoided in this memory cell. That is to say that charge stored in the silicon nitride layer is preserved in a practically unlimited manner. The time period for data retention is therefore considerably longer in this memory cell than in conventional SONOS cells. It is >1000 years instead of 10 years in the case of conventional SONOS cells.

It has been observed that the threshold voltage of the MOS transistors in the memory cells used in the method according to the invention drifts toward higher values with time. This profile of the threshold voltage shows that there is no loss of charge stored in the silicon nitride layer. What occurs, rather, is a migration of the charged stored in the silicon nitride layer in the direction of the substrate.

Since the thicknesses of the first silicon oxide layer and of the second silicon oxide layer in the memory cell used in the method according to the invention are at least 3 nm in each case, the probability for direct tunneling of charge carriers through the two silicon oxide layers is very small. Charge carrier transport through the first silicon oxide layer and/or second silicon oxide layer takes place only as a result of Fowler-Nordheim tunneling. The current intensity of the charge carrier transport as a result of Fowler-Nordheim tunneling depends only on the strength of the applied electric field. It is not explicitly dependent on the thickness of the tunneling barrier, that is to say that thickness of the first silicon oxide layer and/or second silicon oxide layer.

In the method according to the invention, different threshold voltage levels of the MOS transistor are assigned to different logic values. Owing to the long time period for data retention, these threshold voltage levels are very stable and, therefore, it is possible to provide a large number of threshold voltage levels per volt.

The threshold voltage levels can be separated from one another by identical of different amounts. Since the temporal drift of the threshold voltage levels is greater for larger threshold voltage levels than for smaller ones, it is advantageous to define the threshold voltage levels such that the amount separating neighboring threshold voltage levels increases as the threshold voltage level increases.

According to one embodiment, the memory cell has a gate electrode made of n-doped silicon, metal or a metal silicide. In this memory cell, the Fowler-Nordheim tunneling of electrons dominates the charge carrier transport irrespective of the polarity of the applied field. That is to say that not only when a positive voltage is applied but also when a negative voltage is applied to the gate electrode. Fowler-Nordheim tunneling of electrons into the silicon nitride layer occurs. If a positive voltage is applied to the gate electrode, then electrons tunnel from the channel region through the first silicon oxide layer into the silicon nitride layer. If, on the other hand, a negative voltage is applied to the gate electrode, then electrons tunnel by Fowler-Nordheim tunneling from the gate electrode through the second silicon oxide layer into the silicon nitride layer.

Since, in this memory cell, electrons are transported into the silicon nitride layer as a result of Fowler-Nordheim tunneling irrespective of the polarity applied to the gate electrode, electrons cannot be removed again once they have been transported into the silicon nitride layer. The memory cell therefore has a very long time period for data retention. The threshold voltage levels are so stable over time that it is possible to provide 64 threshold voltage levels in a voltage window of 4 volts.

In this memory cell, the difference between the thicknesses of the first silicon oxide layer and of the second silicon oxide layer preferably lies in the range between 0.5 nm and 1 nm. The smaller of the thicknesses of the first silicon oxide layer and of the second silicon oxide layer lies in the range between 3 nm and 6 nm. The thickness of the silicon nitride layer is at least 5 nm. In another embodiment of the invention, a memory cell is used which has a gate electrode made of $p^+$-doped silicon. In comparison with n-doped silicon or metal, which is used as gate electrode in the first embodiment, in the ideal case the $p^+$-type doping reduces the occupation probability of electronic states in the gate electrode approximately by a factor of $10^{20}$. Therefore, information stored in the memory cell can be electrically erased. No electrons can tunnel from the gate electrode into the silicon nitride layer during the erase operation, owing to the reduced occupation probability of electronic states. The erase operation of the memory cell according to the invention therefore takes place by way of holes tunneling from the channel region through the first silicon oxide layer into the silicon nitride layer and by electrons tunneling from the silicon nitride layer into the channel region. In the case of memory cells having gate electrodes which are rich in electrons, electrons additionally tunnel from the gate electrode into the silicon nitride layer, which likewise have to be neutralized during the erase operation. This electron current is suppressed in the memory cell used here by the fact that the number of electrons in the gate electrode is reduced by the use of $p^+$-doped silicon. Compared with memory cells having gate electrodes which are rich in electrons, the time for the erase operation is reduced by a factor of approximately $10^5$ in this memory cell.

However, the loss of charge from the silicon nitride layer as a result of direct tunneling in this case is a plurality of orders of magnitude higher than compared with memory cells having gate electrodes which are rich in electrons. For this reason, it is only possible to provide a smaller number of threshold voltage levels per volt. Given erase times of the order of magnitude of 1 second, 4 to 8 threshold voltage levels are possible in a window of 4 volts.

With regard to erase times of less than 30 seconds, it is advantageous in this memory cell to give the first silicon oxide layer and the second silicon oxide layer a thickness of between 3.2 nm and 4 nm.

Memory cell arrangements which, as is generally customary, have a multiplicity of identical memory cells in the form of a matrix can be operated by the method according to the invention.

The MOS transistors in the memory cells can be designed both as planar and as vertical MOS transistors.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
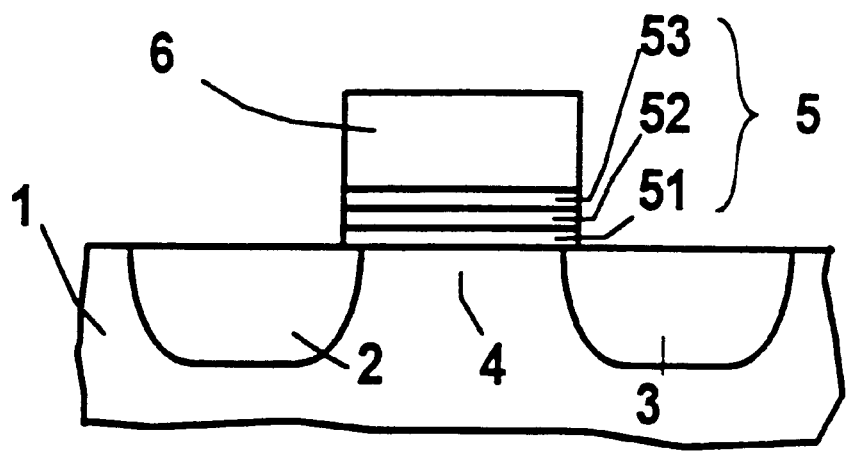
FIG. 1 shows a memory cell with a planar MOS transistor having a gate electrode made of n-doped silicon.

A source region 2 and a drain region 3, which are n-doped, for example, are provided in a substrate 1 comprising monocrystalline silicon at least in the region of a memory cell (see FIG. 1). A channel region 4 is arranged between the source region 2 and the drain region 3. Source region 2, channel region 4 and drain region 3 are, for example, arranged next to one another on the surface of the substrate 1. As an alternative, they may also be arranged in the form of a vertical layer sequence.

Arranged above the channel region 4 is a dielectric triple layer, which comprises a first SiO$_2$ layer 51, an Si$_3$N$_4$ layer 52 and a second SiO$_2$ layer 53. The first SiO$_2$ layer 51 is arranged on the surface of the channel region 4 and has a thickness of 3 to 6 nm, preferably 5 nm. The Si$_3$N$_4$ layer 52 is arranged on the surface of the first SiO$_2$ layer 51. It has a thickness of at least 5 nm, preferably 8 nm. The second SiO$_2$ layer 53 is arranged on the surface of the Si$_3$N$_4$ layer 52 and its thickness is 0.5 to 1 nm greater than the thickness of the first SiO$_2$ layer 52, that is to say it lies in the range between 3.5 and 6.5 nm, and is preferably 4.5 nm.

A gate electrode 6 made of n$^+$-doped polysilicon, for example, is arranged on the surface of the dielectric triple layer 5. The gate electrode 6 has a thickness of 200 nm, for example, and a dopant concentration of $10^{21}$ cm$^{-3}$, for example. Alternatively, the gate electrode 6 can also be formed from metal, for example aluminum, or a metal silicide, for example TiSi$_2$.

In order to operate a memory cell arrangement having a multiplicity of identical memory cells of the kind illustrated in FIG. 1, the information is stored in the sense of multi-value logic, for example with $2^5$=32 values. For this purpose, 32 threshold voltage levels are defined in a threshold voltage window of 3.2 volts, for example. The following holds true, for example:

| Number of the threshold voltage level | Threshold voltage level (mV) |
| --- | --- |
| 0 | 400 |
| 1 | 442 |
| 2 | 488 |
| 3 | 538 |
| 4 | 592 |
| 5 | 650 |
| 6 | 712 |
| 7 | 778 |
| 8 | 848 |
| 9 | 922 |
| 10 | 1000 |
| 11 | 1082 |
| 12 | 1168 |
| 13 | 1258 |
| 14 | 1352 |
| 15 | 1450 |
| 16 | 1552 |
| 17 | 1658 |
| 18 | 1768 |
| 19 | 1882 |
| 20 | 2000 |
| 21 | 2122 |
| 22 | 2248 |
| 23 | 2378 |
| 24 | 2512 |
| 25 | 2650 |
| 26 | 2792 |
| 27 | 2938 |
| 28 | 3088 |
| 29 | 3242 |
| 30 | 3400 |
| 31 | 3562 |

The amount separating neighboring threshold voltage levels increases as the threshold voltage level increases. In the case of the smallest threshold voltage levels around 0.4 volt, said amount separating neighboring threshold voltage levels is 0.04 volt; in the case of threshold voltage levels around 3.4 volts, said amount separating neighboring threshold voltage levels is 0.15 volt. The temporal drift of the threshold voltage level over 10 years amounts to 25 mV given an initial threshold voltage level of 2 volts, and 42 mV given an initial threshold voltage level of 3.5 volts.

In order to write in the information, voltage levels between 11.5 volts and 15.5 volts are applied to the gate electrode given a writing time of 1 ms.

In order to read out the information, the threshold voltage level of the memory cell can be evaluated, on the one hand. On the other hand, the dependence of the current flowing through the transistor on a control voltage applied to the gate electrode can be evaluated.

Figure 2:
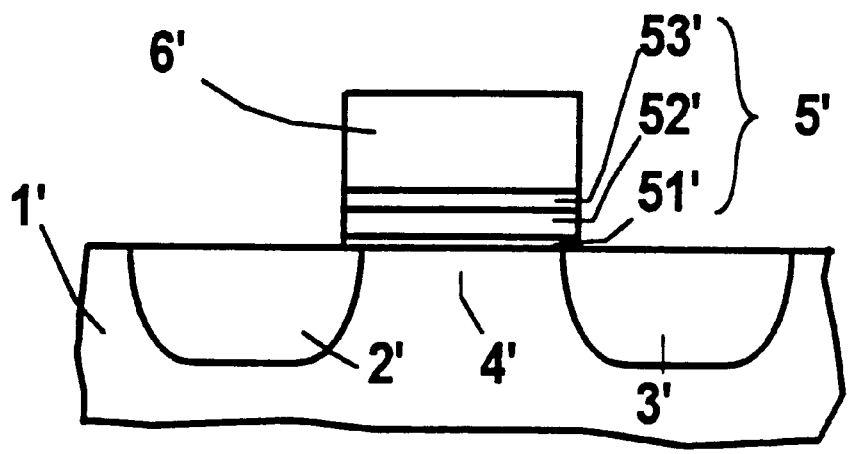
FIG. 2 shows a memory cell with a planar MOS transistor having a gate electrode made of p$^+$-doped silicon.

A source region 2' and a drain region 3', which are n-doped, for example, are provided in a substrate 1' comprising monocrystalline silicon at least in the region of a memory cell (see FIG. 2). A channel region 4' is arranged between the source region 2' and the drain region 3'. Source region 2', channel region 4' and drain region 3' are, for example, arranged next to one another on the surface of the substrate 1'. As an alternative, they may also be arranged as a vertical layer sequence.

Arranged above the channel region 4' is a dielectric triple layer, which comprises a first SiO₂ layer 51', an Si₃N₄ layer 52' and a second SiO₂ layer 53'. The first SiO₂ layer 51' is arranged on the surface of the channel region 4' and has a thickness of 3.2 to 4 nm, preferably 3.5 nm. The Si₃N₄ layer 52' is arranged on the surface of the first SiO₂ layer 51', and it has a thickness of at least 5 nm, preferably 8 nm. The second SiO₂ layer 53' is arranged on the surface of the Si₃N₄ layer 52', and its thickness lies in the range between 3.5 and 6.5 nm, and is preferably 4.5 nm.

A gate electrode 6' made of p$^+$-doped polysilicon, for example, is arranged on the surface of the dielectric triple layer 5'. The gate electrode 6' has a thickness of 200 nm, for example, and a dopant concentration of $5\times10^{20}$ cm$^{-3}$, for example.

In order to operate a memory cell arrangement having a multiplicity of identical memory cells of the kind illustrated in FIG. 2, the information is stored in the sense of multi-value logic, for example $2^2=4$ values. For this purpose, 4 threshold voltage levels are defined in a threshold voltage window of 4 volts, for example. The following holds true, for example:

| Number of the threshold voltage level | Threshold voltage level (volts) | Temporal drift in 10 years (mV) |
| --- | --- | --- |
| 0 | 0.0 | +50 |
| 1 | 1.0 | -100 |
| 2 | 2.0 | -400 |
| 3 | 3.5 | -1000 |

The amount separating neighboring threshold voltage levels increases as the threshold voltage level becomes increasingly removed from the threshold voltage value of the MOS transistor in the absence of any charge stored in the silicon nitride layer. In the case of the threshold voltage levels being removed from the threshold voltage value of the MOS transistor in the absence of any charge stored in the silicon nitride layer by the smallest amounts around 0.5 volt, said amount separating neighboring threshold voltage levels is 1.0 volt; in the case of the threshold voltage levels being removed from the threshold voltage value of the MOS transistor in the absence of any charge stored in the silicon nitride layer by amounts around 3 volts, said amount separating neighboring threshold voltage levels is 1.5 volts. The temporal drift of the threshold voltage level over 10 years amounts to −1000 mV given an initial threshold voltage level of 3.5 volts and 50 mV given an initial threshold voltage level of 0 volts.

In order to write the information to a memory cell in the initial state with a writing time of 1 ms, voltage levels between +10 volts and +14 volts are applied to the gate electrode.

In order to read out the information, the threshold voltage level of the memory cell can be evaluated, on the one hand. On the other hand, the dependence of the current flowing through the transistor on a control voltage applied to the gate electrode can be evaluated.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrated and not in a limiting sense.

What is claimed is:

1. A method for operating a memory cell arrangement, comprising the steps of:

providing memory cells having MOS transistors;

providing said MOS transistors with a gate dielectric including a dielectric triple layer having a first silicon oxide layer, a silicon nitride layer and a second silicon oxide layer;

providing the first silicon oxide layer and the second silicon oxide layer each with a thickness of at least 3 nm;

using multi-value logic with more than two logic values to store information;

applying a respective quantity of charge assigned to the respective logic value to the gate dielectric by Fowler-Nordheim tunneling for writing a respective logic value of the more than two logic values to one of the memory cells; and storing the respective quantity of charge in the gate dielectric, said quantity of charge effects a threshold voltage level of the MOS transistor which is assigned to the respective logic value.

2. The method as claimed in claim 1, further comprising the step of:

increasing an amount separating neighboring threshold voltage levels as the threshold voltage level increases.

3. The method as claimed in claim 1, wherein a difference between thicknesses of the first silicon oxide layer and the second silicon oxide layer lies in a range between 0.5 nm and 1 nm, wherein a smaller of the thicknesses of the first silicon oxide layer and of the second silicon oxide layer lies in a range between 3 nm and 6 nm, wherein the silicon nitride layer has a thickness of at least 5 nm, and wherein each of the MOS transistors has a gate electrode made of n-doped silicon.

4. The method as claimed in claim 3, further comprising the step of:

using multi-value logic with 2n values, where n is between 2 and 6.

5. The method as claimed in claim 1, wherein a difference between thicknesses of the first silicon oxide layer and the second silicon oxide layer lies in a range between 0.5 nm and 1 nm, wherein a smaller of the thicknesses of the first silicon oxide layer and of the second silicon oxide layer lies in a range between 3.2 and 4 nm, wherein the silicon nitride layer has a thickness of at least 5 nm, and wherein each of the MOS transistors has a gate electrode made of p$^+$-doped silicon.

6. The method as claimed in claim 5, wherein p$^+$-doped silicon in the gate electrode has a dopant concentration of at least $1\times10^{20}$ cm$^{-3}$.

7. The method as claimed in claim 5, further comprising the step of:

using multi-value logic with 2n values, where n is between 2 and 3.

* * * * *